(12) United States Patent
Kato et al.

(10) Patent No.: US 7,642,194 B2
(45) Date of Patent: Jan. 5, 2010

(54) METHOD FOR ETCHING AND APPARATUS FOR ETCHING

(75) Inventors: Yuji Kato, Okazaki (JP); Eiji Ishikawa, Okazaki (JP); Yutaka Kudou, Kudamatsu (JP); Satoshi Tani, Kudamatsu (JP); Kazuo Takata, Kudamatsu (JP)

(73) Assignee: DENSO CORPORATION, Kariya (JP)

( * ) Notice: Subject to any disclaimer, the term of this patent is extended or adjusted under 35 U.S.C. 154(b) by 304 days.

(21) Appl. No.: 11/505,375

(22) Filed: Aug. 17, 2006

(65) Prior Publication Data

US 2007/0048954 A1 Mar. 1, 2007

(30) Foreign Application Priority Data

Aug. 25, 2005 (JP) ............................. 2005-244329

(51) Int. Cl.
*H01L 21/302* (2006.01)
(52) U.S. Cl. .................. 438/714; 438/710; 438/712; 156/345.48
(58) Field of Classification Search ................ 438/706, 438/710, 712, 719, 720, 714; 156/345.39, 156/48
See application file for complete search history.

(56) References Cited

U.S. PATENT DOCUMENTS

| 6,332,425 B1* | 12/2001 | Kofuji et al. ......... 118/723 MA |
| 6,593,244 B1* | 7/2003 | Wang et al. ................. 438/706 |
| 6,620,737 B2 | 9/2003 | Saito et al. |
| 6,634,177 B2* | 10/2003 | Lin et al. ....................... 62/3.2 |
| 6,635,185 B2* | 10/2003 | Demmin et al. ............... 216/64 |
| 2003/0022512 A1 | 1/2003 | Saito et al. |
| 2003/0100151 A1* | 5/2003 | Okamoto .................... 438/163 |

FOREIGN PATENT DOCUMENTS

| JP | A-08-241885 | 9/1996 |
| JP | A-2002-158214 | 5/2002 |
| JP | A-2003-133285 | 5/2003 |

OTHER PUBLICATIONS

Notice of Reasons for Refusal mailed on May 26, 2009 in the corresponding Japanese patent application No. 2005-244329 (with English translation thereof).

\* cited by examiner

*Primary Examiner*—Lan Vinh
(74) *Attorney, Agent, or Firm*—Posz Law Group, PLC

(57) ABSTRACT

A method of etching for forming a groove in a SOI substrate includes a forming step, in which a mixed gas plasma is formed by using a mixed gas of a fluorinate gas and an oxygenic gas, and an applying step, in which a high-frequency bias is intermittently applied to the SOI substrate. In the applying step, the high-frequency bias is a temporally modulated high-frequency electricity. According to the method of etching, a yielding rate and a productivity can be improved.

10 Claims, 9 Drawing Sheets

| PROCESS CONDITION | | 1 |
|---|---|---|
| SF$_6$ GAS FLOW (ml/min) | | 120 |
| O$_2$ GAS FLOW (ml/min) | | 30 |
| MICROWAVE (W) | | 600 |
| PRESSURE (Pa) | | 1.5 |
| RF | BIAS | TM |
| | POWER (w) | 100 |
| | DUTY RATIO (%) | 30 |
| | FREQ. (kHz) | 1.0 |
| SUBSTRATE TEMPERATURE (°C) | | −45 |
| CURRENT (A) | | TOP/MIDDLE/BOTTOM |
| | | 14/14/3 |
| PROCESSING TIME (min) | | 300 |

FIG. 17

| PROCESS CONDITION | | 1 | 2 |
|---|---|---|---|
| $SF_6$ GAS FLOW (ml/min) | | 120 | 120 |
| $O_2$ GAS FLOW (ml/min) | | 30 | 30 |
| MICROWAVE (W) | | 600 | 600 |
| PRESSURE (Pa) | | 1.5 | 1.5 |
| RF | BIAS | CW | TM |
| | POWER (w) | 30 | 100 |
| | DUTY RATIO (%) | - | 30 |
| | FREQ. (kHz) | - | 1.0 |
| SUBSTRATE TEMPERATURE (°C) | | -45 | -45 |
| CURRENT (A) | | TOP/MIDDLE/BOTTOM | TOP/MIDDLE/BOTTOM |
| | | 14/14/3 | 14/14/3 |

US 7,642,194 B2

METHOD FOR ETCHING AND APPARATUS FOR ETCHING

CROSS REFERENCE TO RELATED APPLICATION

This application is based on Japanese Patent Application No. 2005-244329 filed on Aug. 25, 2005, the disclosure of which is incorporated herein by reference.

FIELD OF THE INVENTION

The present invention relates to a method for etching and an apparatus for etching.

BACKGROUND OF THE INVENTION

A dry etching method is conventionally used in order to form a clearance between elements, a contact hole, and a capacitor in a silicon substrate. In the dry etching method, a deep trench is formed in a CZ silicon substrate by using a mixed gas with $O_2$ and $Cl_2$ or HBr. The mixed gas has a high depositional tendency so that a deposition of a sidewall protecting film is faster than the etching of silicon in the conventional method using the mixed gas. Therefore, a speed of the silicon etching is slow. Further, a metallic contamination is caused, since an inner wall of a chamber is corroded by a strong corrosion effect of the mixed gas.

In order to solve this problem, a dry etching method by using mixed gas plasma is suggested. In the method, a mixed gas with a fluorinate gas, e.g., $SF_6$ gas, and an oxygenic gas, e.g., $O_2$ gas, generates plasma. Ions and radicals of S, F, and O are dissociated from the $SF_6$ gas and the $O_2$ gas, and react with a surface of the Si substrate so that SiF and SiO are generated. In the process of the generation of the SiF, the Si etching is promoted. At the same time, an appropriate amount of the SiO is formed as the sidewall protecting film. Therefore, an isotropic etching by the F-radical is reduced so that an anisotropic and fast etching can be performed. Moreover, in the dry etching method, the SiO film layer, which is generated by the reaction of the silicon substrate and the mixed gas plasma with the $SF_6$ gas and the $O_2$ gas, is formed thinly on the inner wall of a chamber so that a generation of a foreign object due to a removal of an attachment is less, and a wet cycle following the dry etching in order to remove a mask can be kept long.

Furthermore, the SiO film layer formed thinly on the inner wall of the chamber prevents a metal contamination generated on a chamber member from scattering toward the Si substrate. Also, a characteristic trouble of a semiconductor device formed on the substrate can be reduced.

In the conventional method using the $SF_6$ gas and the $O_2$ gas, when an etching process is performed in a SOI (Silicon On Insulater) substrate, the anisotropic etching toward a lower oxide film layer 22 deteriorates so that a side etching region 23 is locally generated as shown in FIG. 2. Number 24 shown in FIG. 2 is a mask. In the etching process, there are physical reactions, e.g., a sputtering by applying a RF wave on the substrate, and chemical reactions by the dissociated radicals. In the side etching region 23, the isotropic Si etching is promoted by the chemical reactions with the dissociated radicals. In the etching process of silicon layer 21, Si—F is generated by a reaction with the F-ion and the Si layer 21. A reaction between the Si—F and the O-ion provides a $SiO_2$ layer film as the protecting film on the sidewall of a trench. However, when the etching reaches the lower oxide film layer 22 of the SOI substrate, in which the etching rate is low, the generation of the Si—F is decreased so that the protecting film of $SiO_2$ becomes thin. This is because the etching rate of the lower oxide film layer 22 is low. In contrast, excess F-ions and F-radicals derived from the F-ions due to the decrease in the reaction of the silicon layer 21 promote to form the side etching region 23 of the silicon layer 21 along with the lower oxide film layer 22 of the SOI substrate, in which the $SiO_2$ protecting film is thin.

A conductor or an insulator is embedded in the trench. For example, when the trench is used for separation between elements, an insulating film such as a silicon oxide film is embedded in the trench. However, a hole, i.e., void, is formed in the silicon oxide film due to an incompletion of the embedment when the side etching region 23 exists. The void causes an increase of a leak current and a decrease of a withstand voltage, and therefore, a yielding rate of the semiconductor device is reduced. Accordingly, a prevention of the generation of the side etching region 23 is an important technology for securing the characteristic of the semiconductor device.

In addition, as shown in FIG. 3, a residual needle, i.e., a black silicon 25, is generated on an external portion of a Si wafer 26. The black silicon 25 is broken in a following washing process. A dust of the black silicon 25 is adsorbed on the surface of the semiconductor substrate and contaminates a washing tank. The black silicon 25 causes problems such as a decrease in a yielding rate and a productivity of the semiconductor device.

The black silicon 25 can be eliminated by increasing a ratio of the $SF_6$ gas to the $O_2$ gas compared with a conventional ratio. However, the increase of the $SF_6/O_2$ ratio causes a decrease of the sidewall protecting film so that a side etching region 27 is generated just beneath the mask 24, as shown in FIG. 4.

Furthermore, JP-A-8-241885 discloses a method for preventing a generation of a notching, in which a maximum electric potential of an object in a surface treatment process is kept higher than that of plasma. In the method, a pulse power source is provided in place of a conventional sine wave high-frequency power source as a bias power source. A duty ratio of the pulse power source is equal to or less than 5%. Applying a pulse voltage having a rising speed equal to or more than 103 V/μs generates an electric field, in which an electron is accelerated toward a substrate. However, this method cannot solve the above-described problem, in a case where the etching of the trench having a high aspect ratio is performed by using the fluorinate gas and the oxygenic gas.

SUMMARY OF THE INVENTION

In view of the foregoing and other problems, it is an object of the present disclosure to provide a method of etching for forming a groove. It is another object of the present disclosure to provide an apparatus for etching.

According to a first aspect of the disclosure, a method of etching for forming a groove in a SOI substrate includes a forming step, in which a mixed gas plasma is formed by using a mixed gas of a fluorinate gas and an oxygenic gas, and an applying step, in which a high-frequency bias is intermittently applied to the SOI substrate. The high-frequency bias is a temporally modulated high-frequency electricity.

According to a second aspect of the disclosure, an apparatus for etching at least one of a trench and a hole in a SOI substrate includes a container, an electrode disposed in the container, on which the SOI substrate is disposed, a microwave power source for generating a plasma, a solenoid coil for generating a magnetic field, which is disposed on an external wall of the container, a gas supplying portion for supplying a mixed gas with a fluorinate gas and an oxygenic gas into the container, a cooling portion for cooling the SOI substrate on the electrode, and a high-frequency power source for supplying a high-frequency bias intermittently to the electrode, in which the high-frequency bias is a temporally modulated high-frequency electricity, and the high-frequency bias has a modulation frequency in a range between 1 kHz and 2 MHz.

According to the first and second aspects of the disclosure, a yielding rate and a productivity can be improved because generations of a side etching region and a black silicon needle can be prevented.

BRIEF DESCRIPTION OF THE DRAWINGS

The above and other objects, features and advantages of the present invention will become more apparent from the following detailed description made with reference to the accompanying drawings. In the drawings:

FIG. 17 is a table showing etching conditions according to the second embodiment.

DETAILED DESCRIPTION OF PREFERRED EMBODIMENTS

First Embodiment

Figure 1:
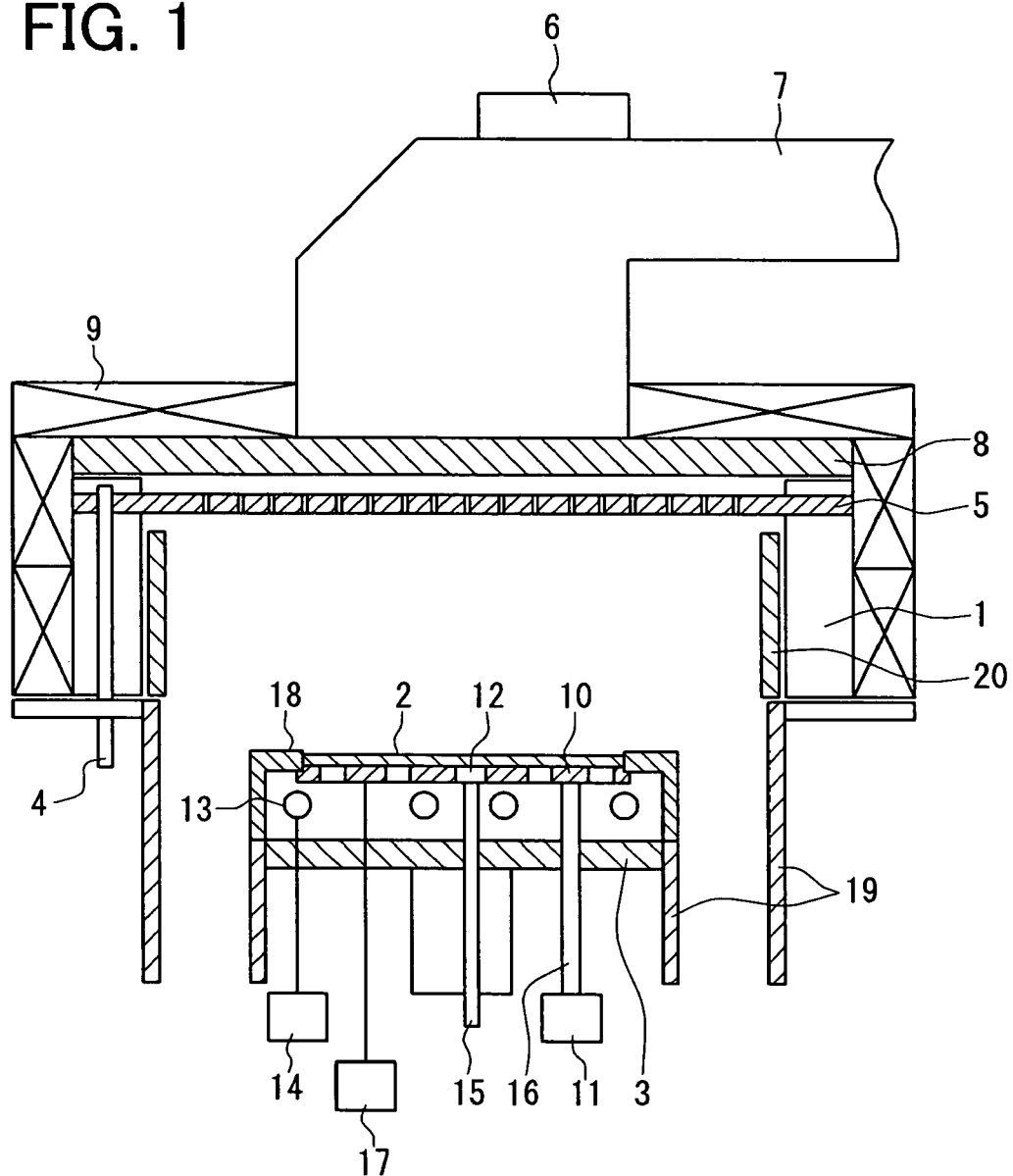
FIG. 1 is a cross-sectional view showing a schematic structure of an etching apparatus according to a first embodiment.
Figure 2:
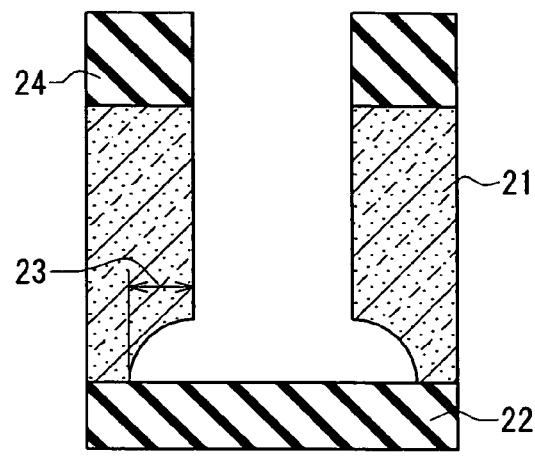
FIG. 2 is a cross-sectional view showing a side etching region generated on a lower oxide film layer of a substrate according to a conventional method.

A plasma etching apparatus according to a first embodiment will be described with reference to FIG. 1. The apparatus is a microwave plasma etching apparatus, in which a microwave and a magnetic field are used in order to form the plasma.

The plasma etching apparatus includes a container 1, a substrate 2 to be processed as an object, i.e., SOI substrate, and a stage 3. The container 1 is a cylindrical shape and made of aluminum or stainless steel. The substrate 2 is disposed on the stage 3.

A chlorofluorocarbon gas, i.e., fluorinate gas, such as $SF_6$, $S_2F_{10}$, $NF_3$, $CF_4$, and $C_2F_8$, an inactive gas such as Ar and $N_2$, and an oxygenic gas such as $O_2$ and CO are supplied homogeneously to the surface of the substrate 2 through a transmission window 5 from a gas feeding port 4. The transmission window 5 has a porous structure. A gas flow controlling element, i.e., MFC, or an air valve (not shown) controls an amount and a timing of the gases supplied to the substrate 2.

An evacuating element such as a turbo-molecular pump (i.e., TMP, not shown) is disposed at a lower part of the container 1. A pressure-controlling element such as an auto pressure controller (i.e., APC, not shown) maintains a predetermined pressure inside of the container 1. A reacted gas after a treatment is discharged to the outside of the container 1 through the evacuating element.

A microwave generated by a magnetron 6 is introduced to the container 1 through a wave-guide 7 and a dielectric window 8. The dielectric window 8 is made of quartz, sapphire, aluminum nitride, and/or boron nitride, which are capable of transmitting an electromagnetic wave.

A solenoid coil 9 for generating a magnetic field is disposed on the external wall of the container 1. Electron Cyclotron Resonance, i.e., ECR, is generated by an interaction of the magnetic field and the incident microwave. Thus, plasma of high density can be formed.

An electrostatic chuck 10 is disposed on the conductive stage 3. Applying a direct current voltage from a power source 17 to the electrostatic chuck 10 generates an electrostatic absorbance force so that the substrate 2 is fixed to the electrostatic chuck 10. An insulating cover 18 made of ceramics and/or quartz is disposed around the substrate 2. A construction provided at the center of the apparatus in order to arrange the substrate 2 represents an electrode in general.

A groove is formed in the surface of the electrostatic chuck 10 so that a passage 12 is formed between the backside of the fixed substrate 2 and the electrostatic chuck 10. Cooling gas such as He, Ar, and $O_2$ is supplied to the passage 12 from a cooling gas feeding port 15. The inside of the passage 12 can be maintained at a predetermined pressure. When the temperature of the surface of the substrate 2 increases, the heat is transmitted to the electrostatic chuck 10 so that the temperature of the surface of the substrate 2 can be maintained at a predetermined temperature. The gas in the passage 12 and the surface of the electrostatic chuck 10 in contact with the substrate 2 perform the heat transmission. In order to cool the substrate 2 at −60° C., refrigerant is circulated in a refrigerant circulating passage 13. The refrigerant circulating passage 13 is embedded inside of the electrostatic chuck 10. A chiller unit 14 controls the temperature of the refrigerant. The refrigerant provides to reinforce a protecting film formed on a sidewall of a trench, and to prevent generation of a side etching region just beneath a hard mask of the trench effectively.

A high-frequency electricity introducing port 16 is connected to the conductive stage 3. A sine wave voltage of 400 kHz or a TM (Time Modulation) bias high-frequency electricity can be applied from the port 16. The TM bias high-frequency electricity represents that a high-frequency electricity biased by an temporally modulation, which is supplied to the substrate intermittently. A controller (not shown) of the etching apparatus controls the power and the timing of the TM bias high-frequency voltage. A high-frequency power source 11 is a variable-frequency power source capable of applying any frequency between 400-1200 kHz.

In order to apply the TM bias high-frequency electricity, an arbitrary waveform generator (not shown) is connected to the high-frequency power source 11. The generator is capable of modulating a high-frequency electricity temporally and supplying the electricity to the electrostatic chuck 10 intermittently. A duty ratio and a period of the TM bias high-frequency electricity can be controlled based on a recipe, i.e., a process condition, registered in the controller of the plasma etching apparatus.

In the container 1, a cylinder 20 made of quartz and a cover 19 are disposed around the electrode. For improving maintenance performance and for preventing metal contaminations, the cylinder 20 is detachable and the surface of the cover 19, which is made of aluminum, is treated with alumite.

That is, in the apparatus for etching at least one of a trench and a hole in the SOI substrate including the container 1, the electrode (stage) 3 disposed in the container 1, on which the SOI substrate is disposed, the microwave power source (magnetron) 6 for generating a plasma, the solenoid coil 9 for generating the magnetic field, which is disposed on the external wall of the container 1, the gas supplying portion 4 for supplying the mixed gas with the fluorinate gas and the oxygenic gas into the container 1, the cooling portion for cooling the SOI substrate on the electrode (cooling gas feeding portions 12, 15, refrigerant circulating passage 13 and chiller unit 14) and the high-frequency power source 11 for supplying the high-frequency bias to the electrode, the mixed gas with the fluorinate gas and the oxygenic gas is supplied from the gas supplying portion 4, the high-frequency bias which is a temporally modulated high-frequency electricity is supplied intermittently to the electrode, in which the frequency range of the high-frequency bias is between 1 kHz and 2 MHz, and the electrode, on which the SOI substrate is disposed, is controlled to be between −30° C. and −60° C. by the cooling portion.

Further, in the etching apparatus, the high-frequency power source 11 is capable of supplying the high-frequency bias continuously and the high-frequency bias, which is temporally modulated, intermittently. The high-frequency power source 11 outputs the high-frequency bias, which is temporally moderated, intermittently after supplying the high-frequency bias continuously.

In addition, in the etching apparatus, the fluorinate gas supplied from the gas supplying portion 4 includes at least one of $SF_6$, $S_2F_{10}$, $NF_3$, $CF_4$, and $C_2F_8$, and the oxygenic gas supplied from the gas supplying portion 4 includes at least one of $O_2$ and CO.

Figures 15, 16:
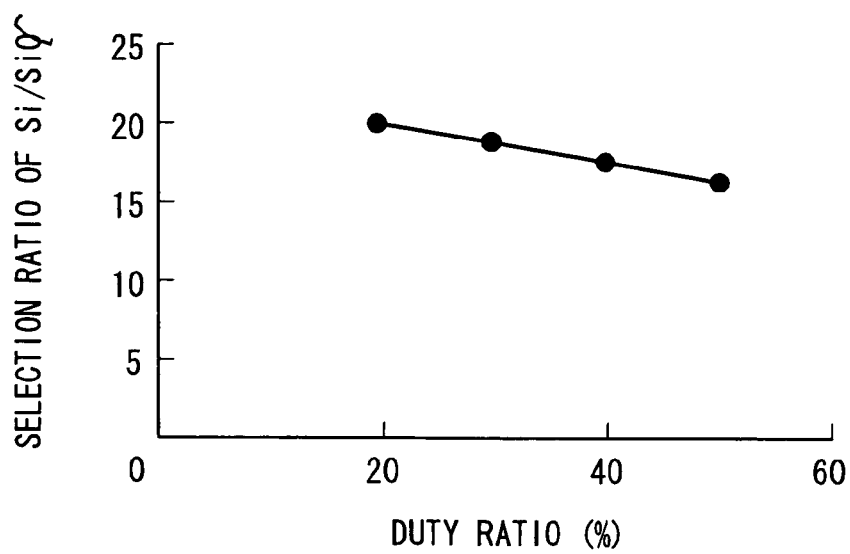
FIG. 15 is a graph showing a relationship between a selection ratio of Si/SiO and the duty ratio according to the other embodiments.
FIG. 16 is a table showing an etching condition according to the first embodiment.

The apparatus according to the first embodiment performs an etching of a deep trench in a SOI substrate in a condition shown in FIG. 16 using the TM bias. The details of the operation will be described with reference to FIGS. 1-7C. In the first embodiment, as shown in FIG. 16, conditions are set as the TM electricity: 100 W, the TM frequency: 1 kHz, the duty ratio: 30%. The high-frequency power applied in unit time in the TM bias is set to be 30 W, and that in the CW bias is also set to be 30 W.

Figure 5:
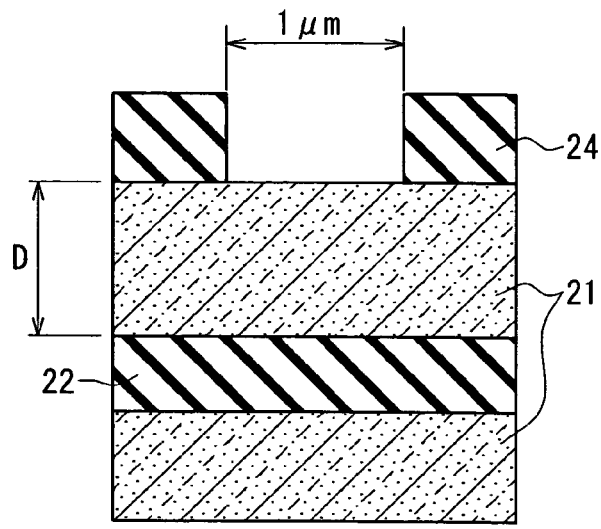
FIG. 5 is a cross-sectional view showing a structure of a substrate according to the first embodiment.

The substrate 2 to be treated shown in FIG. 1 is a SOI substrate shown in FIG. 5. A hard mask pattern 24 of a silicon oxide film is formed on the substrate 2 by using a photolithography method or an etching method. The hard mask pattern 24 is a P-TEOS film, thickness of which is 2.0 μm. A trench pattern, width of which is about 1.0 μm, is formed in the hard mask pattern 24. A silicon oxide film layer 22, thickness of which is several micrometers, is at a position of about 15 μm (in this case, D shown in FIG. 5 is 15 μm) under the mask pattern 24. A depth D has a variation between at a center part and at a periphery part in the substrate 2. Also, the depth D has a variation between substrates 2 so that an etching treatment is operated with a consideration of the variations.

The substrate 2 is transported to the container 1 by a transport portion (not shown) and arranged on the electrostatic chuck 10. An Ar gas, which is controlled to be 100-500 CCM by the gas controlling portion, is supplied to the inside of the container 1. The APC controls the pressure of the inside of the container 1 to be 0.5-20 Pa. 400 W microwave is introduced into the container 1 through the wave-guide 7 so that plasma is formed.

Direct current voltage of −400 V is applied through the power source 17 so that an electric charge is transported through the plasma. Thus, an electrostatic absorbance force is generated. Thus, the substrate 2 to be treated as an object is fixed to the electrostatic chuck 10.

A He gas is supplied to the passage 12 through the cooling gas feeding port 15. The pressure of the inside of the passage 12 is controlled to be 10-20 kPa.

The substrate 2 is cooled to be −45° C. by the heat transmission to the contact face of the electrostatic chuck 10 and the heat transmission of the gas in the passage 12 for a predetermined time.

A stronger absorbance force can be obtained by using the electrostatic chuck 10 having a monopole, compared with that having a dipole. Also, the inside pressure of the passage 12 can be maintained high so that a cooling efficiency can be improved. Alternatively, the electrostatic chuck 10 having the dipole may be used. However, in case of dipole chuck, in order to obtain the same absorbance force as that of the electrostatic chuck 10 having the monopole, applying a higher voltage is needed so that a lifetime of parts of the electrostatic chuck 10 becomes shorter because of, for example, dielectric breakdown of the electrostatic chuck 10. In addition, the absorbance force is different between a negative electrode and a positive electrode in the electrostatic chuck 10 having the dipole. The difference causes a variation of the temperature of the substrate 2 so that it is difficult to prevent a variation of the etching shape.

The electrostatic chuck 10 having the dipole can be used, if areas of the positive electrode and an absorption electrode of the positive electrode side are decreased so that the temperature of the surface of the substrate 2 is uniformed. However, the structure of the electrostatic chuck 10 having the dipole becomes complicated and the cost of the parts of the electrostatic chuck 10 having the dipole increases.

After the substrate 2 is cooled to a predetermined temperature, the microwave is stopped so that the plasma is stopped. After the supplying of the Ar gas is stopped, the inside of the container 1 is evacuated. Then, $SF_6$ gas of 60 CCM and $O_2$ gas of 15 CCM are supplied to the container 1. That is, the inside of the container 1 is replaced with the etching gas. The inside pressure of the container 1 is controlled to be 2.5 Pa by the APC.

Figure 6:
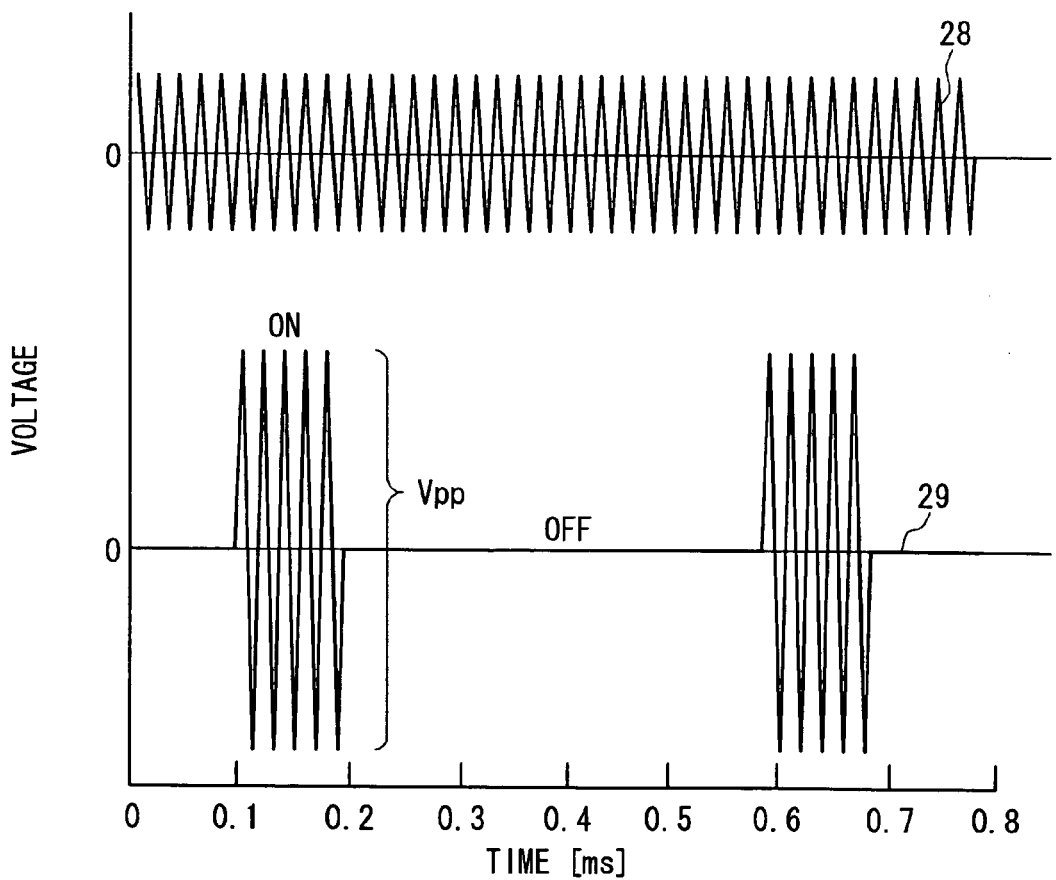
FIG. 6 is a graph showing a CW bias waveform and a TM bias waveform according to the first embodiment.

The plasma is generated by applying a microwave power of 800 W to the inside of the container 1. After the ignition and the stability of the plasma are checked by an optical method, a 400 kHz bias modulated by the arbitrary waveform generator (not shown) is applied to the substrate 2 from the high-frequency electricity introducing port 16. FIG. 6 is a graph showing an example of a conventional 800 KHz CW bias waveform 28, and an example of a 400 KHz TM bias waveform 29 used in the first embodiment. The CW (Continuous Wave) bias represents a conventional bias supplied to an object continuously. The applied power per unit time by the TM bias is fixed, and the applying time by the TM bias can be modulated. Specifically, the applying of the bias to the substrate 2 and the stopping of the bias are temporally modulated. Therefore, a higher voltage can be applied by the TM bias than the CW bias. Even when the applying power per unit time by the TM bias is the same as that by the CW bias, an ion having a high ability in a vertical movement can be generated in accordance with a high Vpp, i.e., a large amplitude, shown in FIG. 6.

The high-frequency power source 11 can apply RF electricity having a maximum power per unit area of 2.8 W/cm$^2$. However, the ion having the high ability in the vertical movement can be generated most effectively by the power per unit area in a range between 0.1 W/cm$^2$ and 0.3 W/cm$^2$. The power per unit area of more than 0.3 W/cm$^2$ cannot effectively generate the ion having the high ability in the vertical movement.

A ratio of a high-frequency applying time to an entire time, which is a sum of a high-frequency applying time and not applying time, is defined as a duty ratio. Applying state of the high-frequency bias can be controlled by the duty ratio. The entire time can be also controlled such that the period of the TM bias can be controlled between 200 Hz and 10 MHz. The OFF-period of the bias is controlled by the period of the TM bias so that a reacting time of a by-product and an adsorption time of the by-product to a sidewall of the chamber can be controlled.

Moreover, changing the frequency of the CW bias and the TM bias enables the ion movement in the vertical direction and the ion energy to be changeable. In the TM bias, lowering the frequency improves the ion movement in the vertical direction. In contrast, in the CW bias, raising the frequency reduces the ion bombardment so that the etching of the SiO$_2$ mask 24 and the side etching region 27 just beneath the mask 24 can be decreased. The levels of the decreases in the etching of the mask 24 and the side etching region 27 under the mask 24 depend on the process condition, the structure of the apparatus such as the structure of the electrode, the plasma density, and the etching gas. Therefore, each appropriate frequency can be determined between 400-1200 kHz in accordance with the etching apparatus and the etching gas to be used.

After the etching of the substrate 2 is performed for a predetermined time, the microwave is stopped so that the plasma is stopped. After the supplying of the etching gas is stopped, the container 1 is evacuated so that the reaction products in the container 1 are discharged. The treatment time of the substrate 2 is controlled based on a recipe, i.e., process condition, registered in the controller (not shown) of the etching apparatus.

Figure 7A:
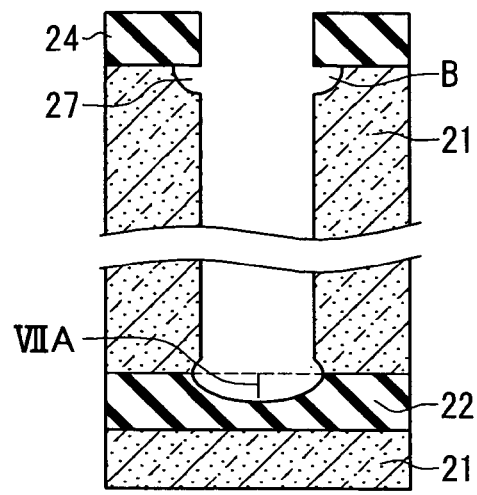
FIG. 7A is a cross-sectional view showing a shape of a trench when a duty ratio is 20% according to the first embodiment.
Figure 7B:
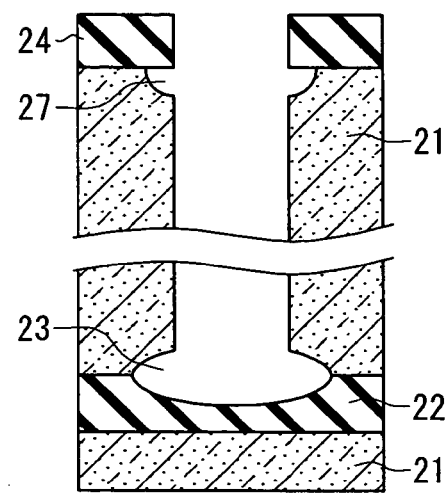
FIG. 7B is a cross-sectional view of a substrate showing a shape of a trench when the duty ratio is 50% according to the first embodiment.
Figure 7C:
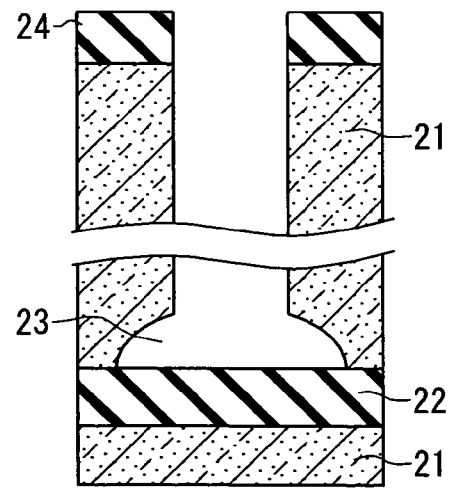
FIG. 7C is a cross-sectional view of a substrate showing a shape of a trench according to the conventional method.
Figure 8:
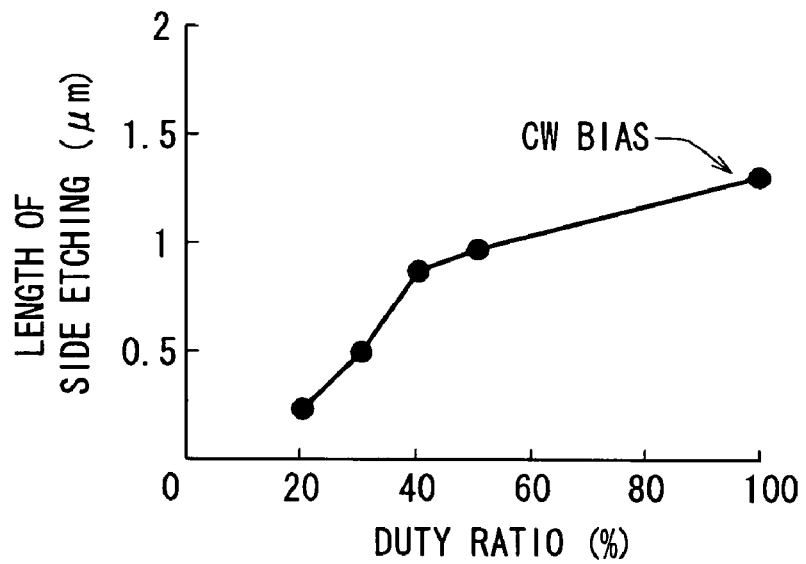
FIG. 8 is a graph showing a relationship between a length of a side etching and a duty ratio of a TM bias applying time according to the first embodiment.

FIGS. 7A-7C are cross sectional views of the substrates 2 showing that the shape of the trench depends on the duty ratio. The duty ratio is 20% in FIG. 7A, and the duty ratio is 50% in FIG. 7B. The etching of the substrate 2 by the conventional method using the CW bias is shown in FIG. 7C for comparing with FIGS. 7A and 7B. Numeric results of a length of the side etching region 23 generated on the lower oxide film layer 22 based on FIGS. 7A-7C are shown in FIG. 8. A horizontal length of the side etching region 23 generated along the sidewall of the trench and the lower oxide film layer 22 shown in FIG. 2 defines the length of the side etching region 23.

As shown in FIG. 8, the length of the side etching region 23 increases with the increase of the duty ratio. When the duty ratio increases from 20% to 50%, the length of the side etching region 23 becomes three times larger. Furthermore, when the duty ratio increases from 50% to 100%, the length of the side etching region 23 becomes 1.4 times larger. The duty ratio of 100% corresponds to the conventional CW bias shown in FIG. 7C. When the trenches are adjacent to each other by a miniaturization, i.e., when a distance between the adjacent trenches is small in case of downsizing, the side etching regions 23 may be connected to each other.

When the duty ratio is equal to or more than 50%, the length of the side etching region 23 is equal to or more than 1 μm so that an embedment of an object such as a conductor or an insulating material in the trench is difficult. In this case, a problem affecting a device characteristic may be caused, such as a leak current. On the other hand, when the duty ratio is equal to or less than 10%, the arbitrary microwave generator cannot be controlled stably so that a variation in the etching shapes is generated. When the duty ratio is 0%, an anisotropic etching cannot be performed. In order to decrease the length of the side etching region 23 and to perform a stable etching, the duty ratio is controlled to be between 10% and 50%. Preferably, the duty ratio is controlled to be between 20% and 40%. The level of the effect on the length of the side etching region 23 by controlling the duty ratio depends on the process condition, the structure of the apparatus such as the structure of the electrode, the plasma density, and the etching gas. Therefore, an appropriate duty ratio can be determined in accordance with the etching apparatus and the etching gas to be used.

When the duty ratio is decreased, the length of the side etching region 23 is decreased. Adversely, a depth VIIA of the etching of the lower oxide film layer 22 is increased as shown in FIG. 7A. When the CW bias is used, the length of the side etching region 23 is increased. However, the CW bias can reduce the depth VIIA of the lower oxide film layer 22 as shown in FIG. 7C. Accordingly, the CW bias is used until the etching reaches near the lower oxide film layer 22 in a first process. Next, the rest of the etching is performed in a second process by using the TM bias. Thus, the side etching region 23 and the etching of the lower oxide film layer 22 can be reduced so that an ideal shape of the deep trench can be obtained.

The reason why the side etching region 23 is decreased by a decrease of the duty ratio is not confirmed clearly. However, a mechanism may be assumed as described below. As shown in FIG. 6, the TM bias 29 having the high Vpp can generate the F-ion having the high ability in the vertical movement. As shown in FIG. 7A, the depth VIIA of the etching of the lower oxide film layer 22 is large, so that the generation of the F-ion having the high ability in the vertical movement can be estimated. In the etching of the silicon layer 21, a large amount of SiF$_4$ is generated by reacting with the F-ion so that the protecting film of SiO$_2$ with a sufficient thickness is formed on the sidewall of the trench by reacting with O-ion. However, when the etching reaches the lower oxide film layer 22, of which the etching speed is low, the thickness of the protecting film of SiO$_2$ is decreased in accordance with the decrease of the SiF$_4$. The F-ion and the F-radical erode the thin protecting film, and the isotropic etching by the F-radical forms the side etching region 23.

In contrast, the TM bias is applied intermittently so that the reacting time for generating SiO$_2$, and the absorbing time of $SiO_2$ to the sidewall of the trench are secured. Therefore, the protecting film of the $SiO_2$ is maintained, and prevented from being eroded by the F-radical.

The TM bias has large ion energy so that the side etching region 27 just beneath the mask 24 is generated by a rebound of the F-ion. The side etching region 27 under the $SiO_2$ mask 24 is obviously formed when the depth D shown in FIG. 5 of the substrate 2 is equal to or more than about 30 μm. When the depth D of the trench is equal to or less than 20 μm, the processing time is relatively short so that the side etching region 27 is less even in a condition the duty ratio is 30%. That is, a problem of a void is not caused.

Second Embodiment

In a second embodiment, a method for etching a trench having 1 μm width in a substrate 2 will be described, in which the depth D shown in FIG. 5 is equal to or more than 30 μm. A description of processes from a start of the method to an ignition of plasma in the second embodiment is similar to that in the first embodiment, and will be omitted.

The process condition of the second embodiment is shown in FIG. 17.

After the plasma ignition by the microwave, a first etching process is performed by the CW bias in a condition shown in FIG. 17. In a first etching process, conditions are set as the $SF_6$ gas flow: 120 ml/min, the $O_2$ gas flow: 30 ml/min, the microwave output: 600 W, the pressure: 1.5 Pa, the bias RF applying method: CW, the RF output: 30 W, the substrate temperature: −45° C., and the coil current (top/middle/bottom): 14/14/3 A. The etching of the trench is performed by the CW bias so that the ion incident energy is reduced, thereby the generation of the side etching region 27 is reduced. In the second embodiment, the first etching process is performed until the depth of the etching reaches 80% of the depth D shown in FIG. 5. Alternatively, the first etching process may be performed just until the depth of the etching reaches the lower oxide film layer 22 in order to decrease the side etching region 27. In addition, variations of the depth D in the substrate 2 and between the substrates 2 have to be considered.

Next, a second etching process is performed by the TM bias in the condition shown in FIG. 17. In the second etching process, conditions are set as the $SF_6$ gas flow: 120 ml/min, the $O_2$ gas flow: 30 ml/min, the microwave output: 600 W, the pressure: 1.5 Pa, the bias RF applying method: TM, the RF output: 10 W, the RF duty ration: 30%, RF frequency: 1.0 kHz, the substrate temperature: −45° C., and the coil current (top/middle/bottom): 14/14/3A. By using the TM bias, the protecting film on the sidewall of the trench adjacent to the lower oxide film layer 22 is strengthened and the side etching region 23 on the lower oxide film layer 22 is reduced.

The etching treatment combined the first etching process under the CW bias and the second etching process under the TM bias can reduce the side etching region 27 just beneath the mask 24, and the side etching region 23 on the lower oxide film layer 22. Moreover, the process time of the second etching process by the TM bias can be reduced so that the etching of the lower oxide film layer 22 can be reduced.

Figure 9:
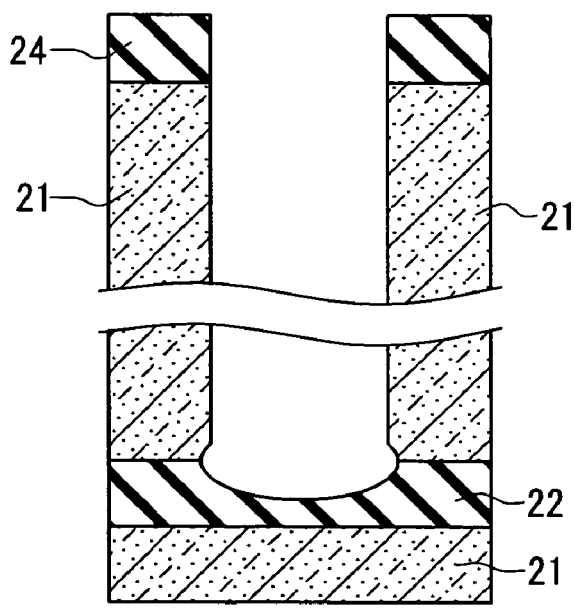
FIG. 9 is a cross-sectional view showing a shape of a trench according to a second embodiment of the present invention.

The shape of the trench obtained in the second embodiment is shown in FIG. 9. The side etching region 27 just beneath the mask 24 and the side etching region 23 on the lower oxide film layer 22 are small. In the second embodiment, the etching of 80% of the depth D is performed by the CW bias, and the etching of residual 20% of the depth D is performed by the TM bias, so that the etching of the lower oxide film layer 22 may be performed a little. However, the ratio of the etched depth between at the first etching process and at the second etching process can be optimized so that the etching of the lower oxide film layer 22 is reduced.

Figure 10:
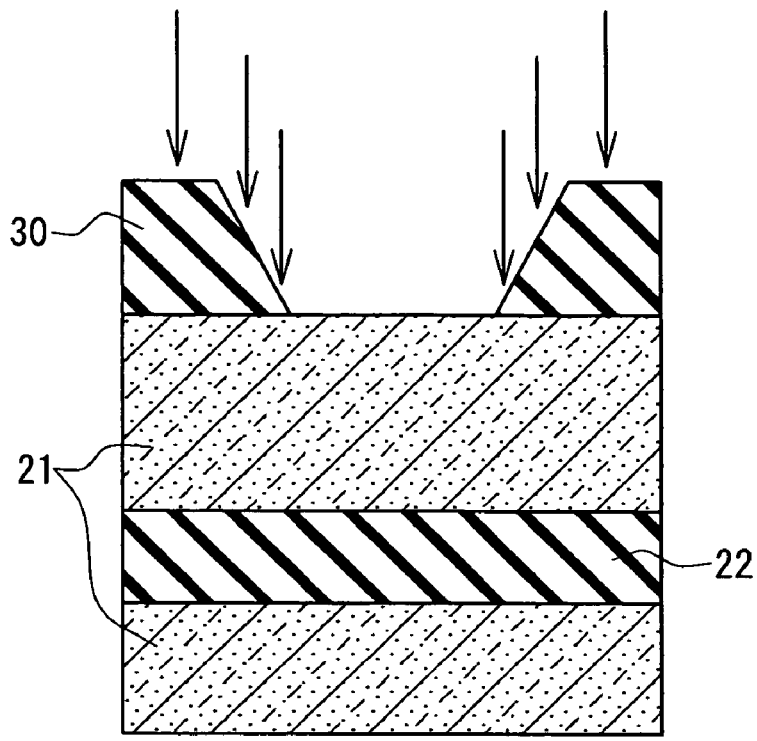
FIG. 10 is a cross-sectional view showing a mask having a forward tapered shape according to the second embodiment.
Figure 11:
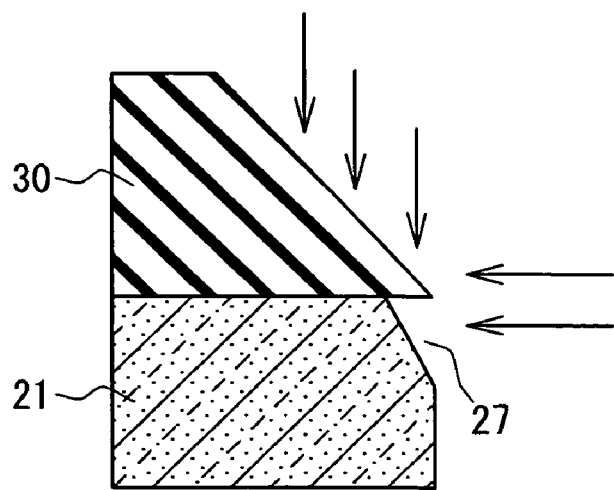
FIG. 11 is a cross-sectional view of a sidewall of the substrate explaining a side etching effect according to the second embodiment.

The etching treatment combined the two processes is also effective for a $SiO_2$ mask 30 having a forward tapered shape shown in FIG. 10. When the $SiO_2$ mask 30 has the forward tapered shape, a void of the mask surface is generated in a part of the mask 30, the thickness of which is small, as shown in FIG. 11. The void of the mask 30 proceeds to the periphery, when the etching of the surface of the mask 30 proceeds. Thus, as shown in FIG. 11, the side etching region 27 is generated just beneath the mask 30.

In this case, using the CW bias having the smaller ion incident energy in the first etching process can reduce the generation of the void of the mask 30. Using the TM bias in the second etching process can also reduce the side etching region 23 on the lower oxide film layer 22. Accordingly, the side etching region 27 just beneath the mask 30 and the side etching region 23 on the lower oxide film layer 22 can be reduced, thereby the shape similar to that shown in FIG. 9 can be obtained.

In the second embodiment, troubles due to the switching of the processes cannot be caused, such as a bump of the sidewall of the trench, a residual needle on the substrate 2, and an etch stop. When switching from the process under CW bias to the process under TM bias is operated, the discharge of the electricity is maintained. Alternatively, the discharge may be stopped and the second etching process may be started after the process condition is accurately set, so that a more stable etching treatment can be performed.

The etching rate of Si is not changed between the CW bias and the TM bias so that the throughput of the etching is not affected. In the second embodiment, other parameters other than the bias change may be set similarly between the first etching process and the second etching process. Alternatively, a better shape of the trench may be obtained by changing the other parameters in each etching process.

Other Embodiments

Figure 3:
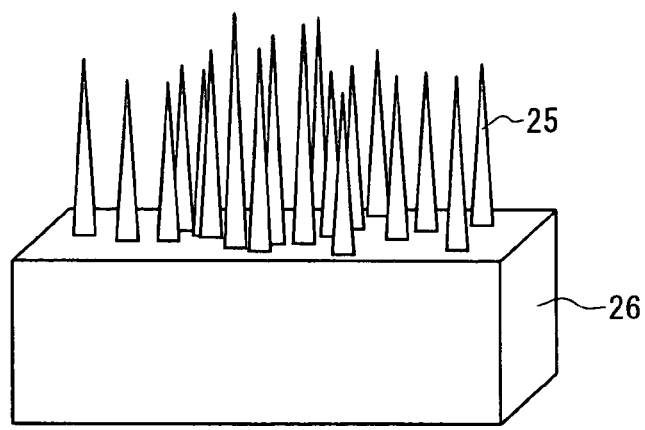
FIG. 3 is a perspective view showing a black silicon needle generated on a part of a silicon substrate not covered with a mask pattern according to the conventional method.
Figure 4:
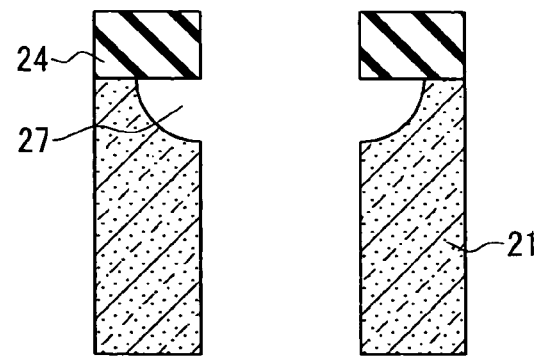
FIG. 4 is a cross-sectional view showing a side etching region generated just beneath a mask according to the conventional method.

In the embodiments, by using a conventional flow ratio, i.e., $SF_6$ gas: $O_2$ gas=3:2, a silicon black 25 shown in FIG. 3 is generated on the external portion of the substrate 2, on which the mask 24 is not formed, and the exposed silicon layer 21, on which the mask 24 is not formed locally on the substrate 2. When the ratio of the $SF_6$ gas to the $O_2$ gas is small, the black silicon 25 is easy to be generated. The reason is that excess by-products of SiO series material are adsorbed to the surface of the substrate 2, and work as a mask so that the etching is stopped.

The black silicon 25 is broken in a washing process using fluorinated acid or the like, and the broken pieces of the black silicon 25 floats in the washing liquid. Thus, The broken pieces of the black silicon 25 are adsorbed to the substrate 2 and cause problems such as a decrease of a yielding rate and a decrease of a productivity caused by necessity of change of washing liquid.

Figure 12:
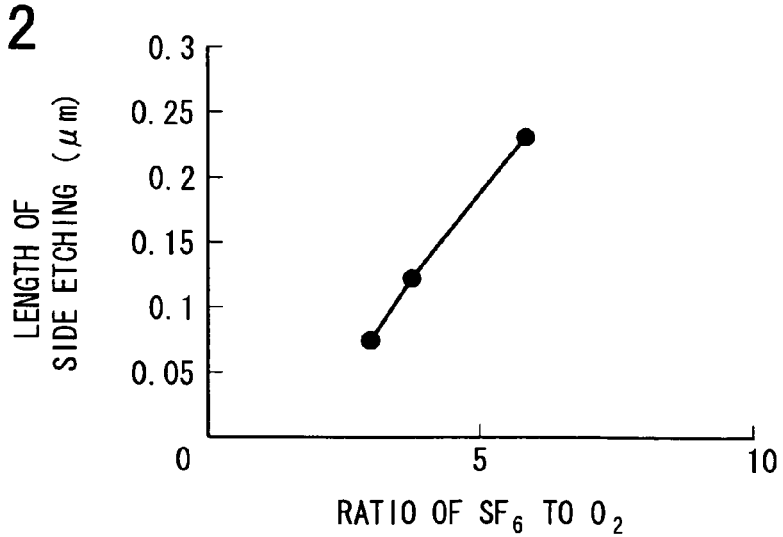
FIG. 12 is a graph showing a relationship between a length of a side etching and a ratio of $SF_6$ gas to $O_2$ gas according to other embodiments.

In order to reduce the generation of the black silicon 25, the ratio of the $SF_6$ gas to the $O_2$ gas may be increased. However, the increase of the $SF_6$ gas causes the side etching region 27 just beneath the mask 24 shown in FIG. 4. FIG. 12 is a graph showing a relationship between a length of the side etching region 27 and the ratio of the $SF_6$ gas to the $O_2$ gas. The definition of the length of the side etching region 27 is the same as that shown in FIG. 2. When the ratio of the $SF_6$ gas increases, F-ion and F-radical increase so that the protecting film formed on the sidewall of the trench is reduced. Therefore, the F-radical erodes the thin protecting film, and the isotropic etching by the F-radical increases the length of the side etching region 27. The side etching region 27 just beneath the mask 24 generates the void and causes the decrease in the yielding rate, when the insulating material is embedded in the trench.

However, when samples having 2-10% opening rate of the mask 24 are tested, the black silicon 25 is generated when the ratio of the $SF_6$ gas to the $O_2$ gas is equal to or less than 3. If the ratio is between 4 and 10, the generation of the black silicon 25 and the side etching region 27 just beneath the mask 24 can be prevented at the same time by strengthening the sidewall protecting film. Optimizing the applying condition of the TM bias and the temperature condition of the substrate except for the gas flow ratio performs the strengthening of the sidewall protecting film.

Figure 13:
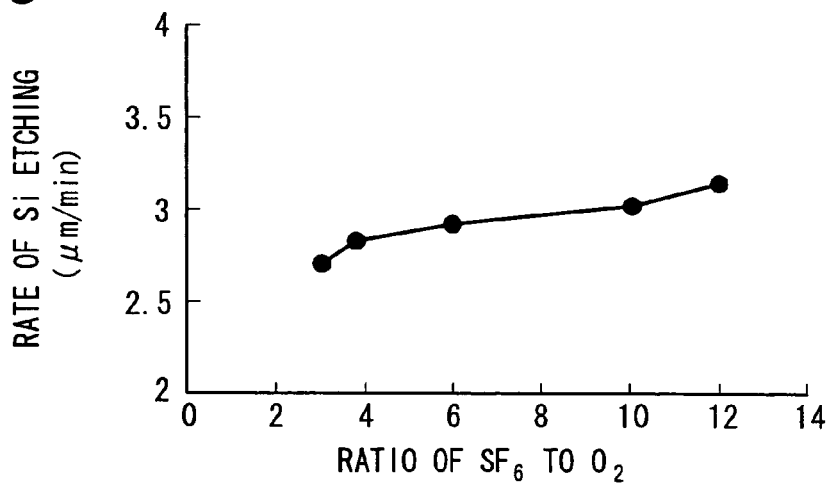
FIG. 13 is a graph showing a relationship between a Si etching rate in a trench processing and the ratio of the $SF_6$ gas to the $O_2$ gas according to the other embodiments.

In addition, in the trench processing, the depth of the trench is between tens of micrometers and hundreds of micrometers. As the depth of the trench becomes larger, a reaching depth of the radical and the ion becomes shallower so that the etching rate of Si decreases. Therefore, when the trench to be etched is deep, an increase in the rate of the Si etching is required for maintaining the productivity. FIG. 13 is a graph showing a relationship between the Si etching rate in the trench processing and the ratio of the $SF_6$ gas to the $O_2$ gas. When the ratio of the $SF_6$ gas increases, the Si etching rate increases, although the increase in the ratio of the $SF_6$ gas causes the generation of the side etching region 27. However, strengthening the sidewall protecting film can prevent the generation of the side etching region 27 just beneath the mask 24. Optimizing the condition of the TM bias and the temperature condition of the substrate 2 performs the strengthening.

Figure 14:
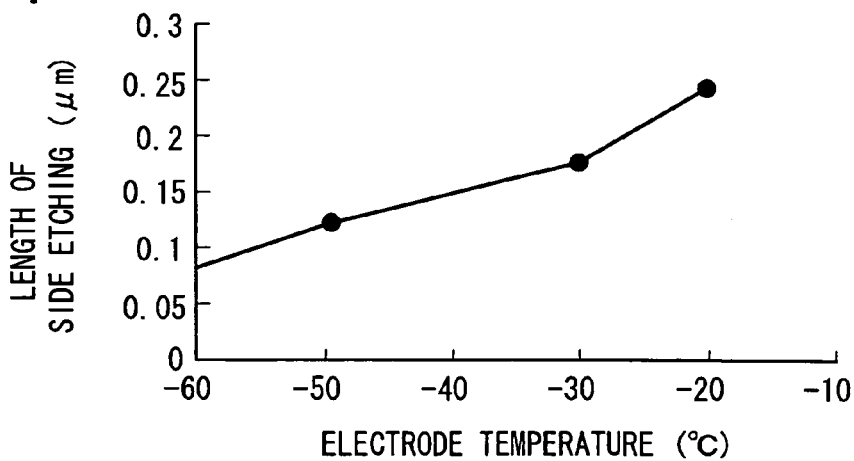
FIG. 14 is a graph showing a relationship between the length of the side etching region under the mask and an electrode temperature according to the other embodiments.

FIG. 14 is a graph showing a relationship between the length of the side etching region 27 beneath the mask 24 and the electrode temperature. The definition of the length of the side etching region 27 is the same as that shown in FIG. 2. When the electrode temperature decreases, the length of the side etching region 27 just beneath the mask 24 decreases. When the electrode temperature is about −50° C., the side etching region 27 is formed slightly a little. However, the generation of the void is not caused after an object is embedded in the trench.

In the process of the etching treatment, the adsorption and desorption of the by-product to be the protecting film on the sidewall of the trench are repeated. The protecting film is formed appropriately by improving the rate of the adsorption by lowering the electrode temperature even when the amount of the by-product is small. Thus, the anisotropic etching can be performed. Accordingly, when the electrode temperature is much lowered, the rate of the adsorption of the protecting film is improved. In the condition where the ratio of the $SF_6$ is equal to or more than 10, the decrease of the side etching region 27 and the increase of the etching rate are performed at the same time. In the present apparatus, the electrode temperature cannot be controlled to be −50° C. or less than −50° C. If the electrode temperature can be controlled to be −60° C., the length of the side etching region 27 may be less than 0.1 μm as shown in FIG. 14. In the substrate 2, in which the depth D shown in FIG. 5 is equal to or less than 20 μm, when the electrode temperature is about −20° C., the side etching region 27 can be reduced sufficiently. In order to form a trench, the depth D of which is equal to or more than hundreds of micrometers, the electrode temperature is controlled to be −60° C. or less, and the strengthening of the protecting film is required.

Further, an OFF time of the high-frequency bias is controlled by adjusting the duty ratio and the period of the TM bias control. The OFF time control provides to control the reacting time of the by-product and the adsorption time of the by-product to the sidewall so that the effect of the protecting film increases. When the period of the TM bias is lowered to 200 Hz, the OFF time becomes long. Therefore, the effect of the protecting film is increased, but the anisotropic etching is decreased. When the period of the TM bias is increased to 10 MHz, the anisotropic etching is secured, but the effect of the protecting film is decreased. In order to maintain the anisotropic etching and the effect of the protecting film at the same time, the period of the TM bias is controlled to be between 500 Hz and 3 MHz. Preferably, the period may be controlled to be between 1 kHz and 2 MHz.

FIG. 15 is a graph showing a relationship between a Si/SiO selection ratio and the duty ratio. The Si/SiO selection ratio represents a ratio of the etching rate of the silicon trench to the etching rate of the mask. When the duty ratio decreases, the selection ratio increases. The reason of this effect is described below. While the applying of the high-frequency voltage is stopped, the etching rate of the mask is decreased. However, the etching rate of the trench is maintained. The ion having the high ability in the vertical movement can reach the bottom of the trench sufficiently so that the etching rate of the trench is maintained. The TM bias is applied intermittently such that, for example, when the duty ratio is 20%, the applying time of the TM bias is 20% compared with the CW bias. Therefore, unnecessary etching of the mask 24 can be decreased. When the duty ratio is 20%, the Si/SiO selected ratio is about 20 as shown in FIG. 15. However, optimizing the amount of the gas flow, the TM bias power, and the applying period of the TM bias can increase the Si/SiO selection ratio to be about 40.

In the embodiments, the microwave plasma etching apparatus using the microwave and the magnetic field is described as an example. However, any method for generating the plasma can be used. A helicon wave plasma etching apparatus, an inductively coupled etching apparatus, a capacity coupling etching apparatus, and a reactive ion etching apparatus having the magnetic field may be used. Moreover, an equivalent effect of the microwave etching apparatus may be obtained from the above-described apparatuses.

While the invention has been described with reference to a preferred embodiment thereof, it is to be understood that the invention is not limited to the preferred embodiment and constructions. The invention is intended to cover various modification and equivalent arrangements. The invention is intended to cover various combinations and configurations, which are preferred, other combinations and configurations, including more, less or only a single element, are also within the spirit and scope of the invention.

What is claimed is:

1. A method of etching for forming a groove in a SOI substrate, the method comprising of:
    forming a mixed gas plasma by using a mixed gas of a fluorinate gas and an oxygenic gas;
    applying a high-frequency bias continuously to the SOI substrate in a first etching step; and
    applying a high-frequency bias intermittently to the SOI substrate in a second etching step, wherein the high-frequency bias is a temporally modulated high-frequency electricity.

2. The method according to claim 1, wherein:
    the fluorinate gas includes at least one of $SF_6$, $S_2F_{10}$, $NF_3$, $CF_4$, and $C_2F_8$; and
    the oxygenic gas includes at least one of $O_2$ and CO.

3. The method according to claim 1, wherein:
    the SOI substrate is disposed on an electrode in a chamber, and the electrode has a temperature in a range between −30° C. and −60° C.

4. The method according to claim 1, wherein:
the high-frequency bias has a modulation frequency in a range between 1 kHz and 2 MHz.

5. The method according to claim 1, wherein:
the high-frequency bias has a power in a range between 0.1 and 0.3 W/cm$^2$.

6. The method according to claim 1, wherein:
the high-frequency bias has a duty ratio of electricity in a range between 20% and 50%.

7. The method according to claim 1, wherein:
in the second etching step, the high-frequency bias intermittently applied to the SOI substrate provides an ON time, in which the high-frequency bias is applied, and an OFF time, in which the high-frequency bias is not applied,
the high-frequency bias has a duty ratio in a range between 20% and 50%, and
the duty ratio defines a ratio of the ON time to a total time of the ON time and the OFF time.

8. The method according to claim 1, wherein:
the fluorinate gas is a SF$_6$ gas;
the oxygenic gas is an O$_2$ gas; and
a flowing ratio between the SF$_6$ gas and the O$_2$ gas is in a range between 4 and 10.

9. The method according to claim 1, wherein:
the first etching step is performed before the second etching step.

10. The method according to claim 1, wherein:
the first etching step is performed such that 80% depth of the groove in the SOI substrate is formed, and
the second etching step is performed such that residual 20% depth of the groove in the SOI substrate is formed after the first etching step.

* * * * *